US00RE43923E

(19) United States
(12) Reissued Patent
Wallner

(10) Patent Number: US RE43,923 E
(45) Date of Reissued Patent: *Jan. 15, 2013

(54) METHOD FOR ORGANIZING AND COMPRESSING SPATIAL DATA

(75) Inventor: Alfred M. Wallner, San Diego, CA (US)

(73) Assignee: Tierravision, Inc., La Jolla, CA (US)

( * ) Notice: This patent is subject to a terminal disclaimer.

(21) Appl. No.: 12/856,512

(22) Filed: Aug. 13, 2010

Related U.S. Patent Documents

Reissue of:
(64) Patent No.: 6,703,947
Issued: Mar. 9, 2004
Appl. No.: 09/668,695
Filed: Sep. 22, 2000

U.S. Applications:
(60) Continuation of application No. 12/198,047, filed on Aug. 25, 2008, now Pat. No. Re. 41,983, which is a division of application No. 11/006,471, filed on Dec. 6, 2004, now Pat. No. Re. 40,466.

(51) Int. Cl.
*H03M 7/00* (2006.01)
(52) U.S. Cl. ..... 341/50
(58) Field of Classification Search ..... 345/501, 345/530, 553, 555; 341/50, 51; 701/213, 701/215; 342/357.09, 357.1; 455/456
See application file for complete search history.

(56) References Cited

U.S. PATENT DOCUMENTS

| | | | | |
|---|---|---|---|---|
| 4,630,209 A | | 12/1986 | Saito et al. | 701/201 |
| 4,888,698 A | | 12/1989 | Driessen et al. | 701/200 |
| 4,972,319 A | | 11/1990 | Delorme | |
| 5,699,255 A | | 12/1997 | Ellis | |
| 5,727,057 A | | 3/1998 | Emery | |
| 5,754,846 A | | 5/1998 | Janse et al. | 707/100 |
| 5,848,373 A | * | 12/1998 | Delorme et al. | 701/200 |
| 5,890,070 A | | 3/1999 | Hamada | |
| 5,946,687 A | | 8/1999 | Gehani | |
| 5,953,722 A | | 9/1999 | Lampert et al. | 707/100 |
| 5,966,135 A | | 10/1999 | Roy et al. | 345/619 |

(Continued)

FOREIGN PATENT DOCUMENTS

EP 0816802 1/1998

(Continued)

OTHER PUBLICATIONS

Lee, J., et al., "A Web-based Bus Information System," Environmental Systems Research Institute, Inc.; Jul. 28, 1999; 18 pgs.

(Continued)

*Primary Examiner* — Brian Young
(74) *Attorney, Agent, or Firm* — Gavrilovich, Dodd & Lindsey, LLP; Charles D. Gavrilovich, Jr.

(57) ABSTRACT

A method for organizing and compressing spatial data to enable fast, incremental downloads of spatial data over a network. The method comprises multiple steps for segmenting and reducing spatial data, and introduces a location-relevant naming system for storing and accessing the data. Applications installed on remote devices are able to efficiently compute data file names based solely on location information, download the data over a network and cache the data on the device.

30 Claims, 3 Drawing Sheets

U.S. PATENT DOCUMENTS

| | | | | |
|---|---|---|---|---|
| 5,968,109 | A | 10/1999 | Israni et al. | 701/208 |
| 5,974,419 | A | 10/1999 | Ashby et al. | 707/101 |
| 5,987,381 | A | 11/1999 | Oshizawa | |
| 6,018,695 | A | 1/2000 | Ahrens et al. | 701/200 |
| 6,038,559 | A | 3/2000 | Ashby et al. | 707/4 |
| 6,055,478 | A | 4/2000 | Heron | |
| 6,073,075 | A | 6/2000 | Kondou | |
| 6,073,076 | A | 6/2000 | Crowley | |
| 6,081,803 | A | 6/2000 | Ashby | |
| 6,107,944 | A | 8/2000 | Behr | |
| 6,122,520 | A | 9/2000 | Want | |
| 6,222,483 | B1 * | 4/2001 | Twitchell | 342/357.1 |
| 6,240,360 | B1 | 5/2001 | Phelan | |
| 6,249,740 | B1 | 6/2001 | Ito | |
| 6,253,151 | B1 | 6/2001 | Ohler | |
| 6,262,741 | B1 | 7/2001 | Davies | |
| 6,263,343 | B1 | 7/2001 | Hirono | |
| 6,304,212 | B1 | 10/2001 | Aoki | |
| 6,321,158 | B1 | 11/2001 | Delorme | |
| 6,324,467 | B1 * | 11/2001 | Machii et al. | 701/200 |
| 6,330,453 | B1 | 12/2001 | Suzuki | |
| 6,336,073 | B1 | 1/2002 | Ihara | |
| 6,343,290 | B1 | 1/2002 | Cossins | |
| 6,363,392 | B1 | 3/2002 | Halstead | |
| 6,393,149 | B2 | 5/2002 | Friederich | |
| 6,477,526 | B2 | 11/2002 | Hayashi | |
| 6,487,495 | B1 | 11/2002 | Gale et al. | |
| 6,526,284 | B1 | 2/2003 | Sharp | |
| 6,532,475 | B1 | 3/2003 | Nakano | |
| 6,584,328 | B1 | 6/2003 | Kung | |
| 6,636,802 | B1 | 10/2003 | Nakano | |
| 6,647,336 | B1 | 11/2003 | Iwata | |
| 6,674,849 | B1 | 1/2004 | Froeberg | |
| 6,718,344 | B2 | 4/2004 | Hirono | |
| 6,748,426 | B1 | 6/2004 | Shaffer | |
| 6,973,386 | B2 * | 12/2005 | Gibbs | 701/208 |
| 6,983,313 | B1 | 1/2006 | Korkea-Aho | |
| 7,010,567 | B1 | 3/2006 | Mori | |
| 7,049,981 | B2 | 5/2006 | Behr | |
| 7,577,520 | B2 * | 8/2009 | Nomura | 701/453 |
| 7,698,057 | B2 * | 4/2010 | Kobayashi et al. | 701/463 |
| 7,705,852 | B2 * | 4/2010 | Blais | 345/555 |
| 7,769,541 | B2 * | 8/2010 | Watanabe | 701/450 |
| RE41,983 | E | 12/2010 | Wallner | |
| 7,894,986 | B2 | 2/2011 | Hegedus | |
| 2001/0044803 | A1 | 11/2001 | Szutu | |
| 2002/0055924 | A1 | 5/2002 | Liming | |

FOREIGN PATENT DOCUMENTS

| | | |
|---|---|---|
| EP | 0932134 | 7/1999 |
| EP | 0990119 | 11/2005 |
| JP | H9-287964 | 11/1997 |
| JP | H10-13961 | 1/1998 |
| JP | H10-282879 | 10/1998 |
| WO | WO 96/07170 | 3/1996 |
| WO | 97/07467 | 2/1997 |
| WO | WO 98/59215 | 12/1998 |
| WO | WO 99/09374 | 2/1999 |
| WO | WO 00/31663 | 6/2000 |

OTHER PUBLICATIONS

"AutoCAD Map 2000i, Release 4.5," Autodesk, Inc.; May 31, 2000; 230 pgs.

"Autodesk MapGuide Users Guide, Release 5," Autodesk, Inc.; Jul. 31, 2000; 193 pgs.

Newton, A., et al., "Designing a Scientific Database Query Server Using the World Wide Web: The Example of Tephrabase," Taylor & Francis Ltd.; Apr. 11, 1997; 11 pgs.

"Distributed Geolibraries: Spatial Information Resources," National Research Council, National Academy Press; Jun. 1999; 136 pgs.

Wei, Z., et al., "Efficient Spatial Data Transmission in Web-Based GIS," ACM, Nov. 6, 1999; 5 pgs.

Honeycutt, D., et al., "Geocoding in Arc/Info," ESRI Press, May 26, 1995; 27 pgs.

Coleman, D.J.; "Geographical Information Systems in Networked Environments" , John Wiley & Sons, Inc.; Jul. 28, 1999; 15 pgs.

Sorokine, A., et al., "Interactive Map Applet for Illustrative Purposes," Association for Computing Machinery, Inc. (ACM), Nov. 7, 1998; 8 pgs.

"MapInfo Professional User's Guide," MapInfo Corporation; May 31, 2000; 713 pgs. Part 1 and Part 2.

Potmesil, Michael; "Maps Alive: Viewing Geospatial Information on the WWW," Elsevier Science B.V.; Sep. 30, 1997; 16 pgs.

O'Leary, Mick; "MapQuest and Maps On Us: Top Web Map Services," Consumer Online, Oct. 31, 1997; 3 pgs.

Ye, T., et al., "Mobile Awareness in a Wide Area Network of Info-Stations," ACM, Oct. 30, 1998; 12 pgs.

Reddy, M., et al., "Modeling the Digital Earth in VRML, Technical Note No. 559," SRI International, Nov. 9, 1998; 11 pgs.

Volz, S., et al., "NEXUS—Distributed Data Management Concepts for Location Aware Applications," Institute for Photogrammetry, University of Stuttgart; May 25, 2000; 15 pgs.

Wahl, R., et al., "Prototype Implementation of the NADMSC Draft Standard Data Model, Greater Yellowstone Area," U.S. Geological Survey Open-File Report 00-325; May 17, 2000; 9 pgs.

"SDE Version 3.0: Projection Engine," Environmental Systems Research Institute, Inc., ESRI Press; Jun. 19, 1997; 41 pgs.

Peterson, John; "SpatialFX: Technology Overview," Object/FX Corporation, 1998; 28 pgs.

Peterson, John; "SpatialX: Technology Overview," Object/FX Corporation, 1998; 48 pgs.

Flammia, G., "The Invisible Internet Meets Desktop Applications," IEEE Intelligent Systems; Nov. 1998; 2 pgs.

Fuller, B., et al., "The Magic Project: From Vision to Reality," IEEE Network; May/Jun. 1996; 11 pgs.

Kreller, B., et al., "UMTS: A Middleware Architecture and Mobile API Approach," IEEE Personal Communications; Apr. 30, 1998; 7 pgs.

Spivey, Kathy et al., "Untangling the Net—Utility GIS/Internet Technology," AM/FM International: Proceedings Conference; Apr. 26, 1998; 11 pgs.

"SpatialFX Deployment: Server and Enterprise Beans Technology Overview," Object/FX Corporation; Object/FX Corporation; Aug. 31, 2000; 32 pgs.

"Wireless Solutions with SpatialFX, Any Client, Anywhere," Object/FX Corporation; Aug. 3, 2000; 1 pg.

Barclay, T., et al., "Microsoft TerraServer: A Spatial Data Warehouse," Microsoft Technical Report MS-TR-99-29; Jun. 1999; different pages cited than Requestor; 16 pages.

U.S. Appl. No. 60/160,561; Spatial Server Architecture, filed Oct. 20, 1999.

U.S. Appl. No. 60/176,489; System and Method Providing Location Context Information Using an Electronic Network, filed Jan. 18, 2000.

Preliminary Invalidity Contentions from RIM Oct. 24, 2011, 104 pages.

Preliminary Invalidity Contentions of Google Inc. Oct. 24, 2011, 106 pages.

Preliminary Invalidity Contentions of Microsoft Corp—Oct. 24, 2011, 61 pages.

Preliminary Invalidity Contentions of Google—Claim Chart Index Oct. 24, 2011, 6 pages.

Preliminary Invalidity Contentions of Microsoft Corp Claim Chart Exhibits 1-77; 467 pages.

Barclay, T., et al., "Microsoft Terraserver: A Spatial Data Warehouse", Microsoft Technical Report MS-TR-99-29 (Jun. 1999);16 pages.

Laurini, R., et al., "Fundamentals of Spatial Information Systems", The APIC Series (1992), 707 pages.

Understanding ArcSDE: ArcSDE 8, Environmental Systems Research Institute, Inc. (ESRI) (1999), 82 pages.

"Using ArcPad: ArcPad 5," Environmental Systems Research Institute, Inc. (ESRI) (2000), 70 pages.

"Map Objects Internet Map Server," Environmental Systems Research Institute, Inc. (ESRI) (1998), 170 pages.

Zavoli, W., et al., "Customer Location Services," Vehicle Navigation & Information Systems Conference Proceedings pp. 613-617 (1994), 5 pages.

Office Action in Inter Partes Reexamination dated Jan. 7, 2012; 126 pages.
Response after Non-Final Office Action for Inter Partes Reexamination of U.S. Patent No. RE41,983; Filed Mar. 7, 2012; 66 pages.
Gadgets Galore: Highlights From Spring Comdex Show, Chicago Tribune, Apr. 2000, 2 pages.
IEEE Standard Dictionary of Electrical and Electronics Terms, 4th Edition, The Institute of Electrical and Electronics Engineers, Inc., 1988, 3 pages.
CV No. 11-CV-2171 DMS; Tierravision, Inc.'S Supplemental Disclosure of Asserted Claims and Preliminary Infringement Contentions, Southern District of California; Oct. 2011, 20 pages.
CV No. 11-CV-0639 DMS; Tierravision, Inc.'S Disclosure of Asserted Claims and Preliminary Infringement Contentions, Southern District of California; Aug. 2011, 52 pages.
"Using MapObjects on the Internet: Map Objects, Internet Map Server"; ESRI; ESRI Press ; 1998; **Part 1 and 2.
E1 Claim Chart: Manner and Pertinency of Applying Using MapObjects on the Internet1, Understanding ArcSDE2, and Using ArcPad3 to Claims 60-66, 68-75, and 77 of U.S. Patent No. RE41,983; 14 pages.
E2 Claim Chart: Manner and Pertinency of Applying Using MapObjects on the Internet1, Understanding ArcSDE2, Using ArcPad3, and Gale to Claims 67 and 76 of U.S. Patent No. RE41,983; 2 pages.
G2 Claim Chart: Pertinency and Manner of Applying U.S. Patent No. 6,487,495 to Gale and Terraserver To Claims 63-64 and 72-73 of U.S. Patent No. RE41,983; 2 pages.
CC-L Claim Chart: Manner and Pertinency of Applying Laurini to Claims 60 and 69 of U.S. Patent No. RE41,983; 11 pages.
CC-M1 Claim Chart: Manner and Pertinency of Applying U.S. Patent No. 6,324,467 to Machii to Claims 69-75 and 77 of U.S. Patent No. RE41,983; 8 pages.
CC-M2 Claim Chart: Manner and Pertinency of Applying U.S. Patent No. 6,324,467 to Machii and Zavoli to Claims 60-68 and 76 of U.S. Patent No. RE41,983; 12 pages.
CC-P1 Claim Chart: Pertinency and Manner of Applying Phelan to Claims 60-66, 68-75, and 77 of U.S. Patent No. RE41,983; 8 pages.
CC-P2 Claim Chart: Pertinency and Manner of Applying Phelan to Claims 67 and 76 of U.S. Patent No. RE41,983; 2 pages.
CC-T Claim Chart: Pertinency and Manner of Applying TerraServer and Oshizawa to Claims 60-77 of U.S. Patent No. RE41,983; 14 pages.
Request for Inter Partes Reexamination of U.S. Patent No. RE41,983; 57 pages.
G1 Pertinency and Manner of Applying U.S. Patent No. 6,487,495 to Gale to Claims 60-62, 65-71, and 74-77 of U.S. Patent No. RE41,983.

* cited by examiner

METHOD FOR ORGANIZING AND COMPRESSING SPATIAL DATA

Matter enclosed in heavy brackets [ ] appears in the original patent but forms no part of this reissue specification; matter printed in italics indicates the additions made by reissue.

*RELATED APPLICATIONS*

*More than one reissue application has been filed for the reissue of the U.S. Pat. No. 6,703,947. The reissue applications are: division of U.S. patent application Ser. No. 11/006,471, filed on Dec. 6, 2004, now U.S. Pat. No. Re. 40,466; continuation of U.S. patent application Ser. No. 12/198,047, filed on Aug. 25, 2008, now U.S. Pat. No. Re. 41,983 (which is the subject of reexamination proceeding 95001801); and U.S. patent application Ser. No. 12/856,512 (the present application). U.S. patent application Ser. No. 12/856,512 (the present application) is a reissue of and claims priority as a reissue of U.S. patent application Ser. No. 09/668,695, now U.S. Pat. No. 6,703,947 and is a continuation reissue application of U.S. patent application Ser. No. 12/198,047, now U.S. Pat. No. Re. 41,983 (which is the subject of reexamination proceeding 95001801), which is a reissue of and claims priority as a reissue of U.S. patent application Ser. No. 11/006,471, now U.S. Pat. No. Re. 40,466 and is a divisional of Reissue application Ser. No. 11/006,471, which is a reissue of U.S. Pat. No. 6,703,947.*

BACKGROUND OF THE INVENTION

1. Field of the Invention

This invention relates to the field of optimization of spatial databases for functional purposes, and in particular to optimize spatial data to achieve minimal download data size for use with cartographic applications in a networked environment.

2. Discussion of Prior Art

A spatial database comprises topographic information in the form of shapes, lines and points encoded with geodetic coordinates, as well as sets of attributes further describing each form. Internet-based applications use the spatial database to generate bitmap images based on user input such as zip code or address on a server and transmit the map images to client devices. Bitmap-based solutions have numerous limitations, which are well known in the art. While prior art describe systems, which transfer vector data to client devices instead of bitmaps, bitmap solutions remain more efficient in terms of data transfer overhead. The initial download size of vector data is significant, and unless the user interacts repeatedly with the map, the total data amount of vector data is greater than the total data amount of bitmap images. Even if the user interacts frequently with the map and the total download size requirements for bitmap and vector data were about the same, most users prefer to have a number of shorter download wait times rather than one long download wait time. Therefore, except for a few non-mainstream applications, bitmap-based solutions are widely used in networked applications.

In navigation systems, a navigation application and spatial data are packaged and supplied as a complete system on a non-volatile storage medium. Said navigation systems may be installed in vehicles or in standalone devices. These navigation systems rely on significant computing resources such as powerful processors and large permanent storage capacities. Prior art introduces solutions, which use structuring and segmenting of spatial databases to improve data access times and navigational functionality. Said solutions are not applicable when computing resources are severely limited, as encountered on personal digital assistants and smartphones, on which one would want to have access to navigation capabilities and maps. Even when said resources are made available for car navigation systems, more powerful hardware results in higher cost for the system. More importantly still, since spatial data changes quite frequently, standalone car navigation systems will inevitably start producing out-of-date navigation instructions over time. It is therefore necessary to update the local database from time to time. Improved methods for updating said local databases have been introduced by prior art. Nevertheless, the requirement to repeatedly update data used by navigation systems remains a major inconvenience for both consumers as well as navigation system suppliers. Suppliers face substantial costs for creating and distributing the data in regular intervals, and any errors discovered after storing data sets on non-volatile media are costly to fix. To address the above problems, it is desirable to keep frequently changing spatial data on a central server and use wireless transmission networks to deliver navigation functionality to remote devices. Navigational functions such as route calculation and driving directions are performed on the server, making it also easier to integrate real-time road traffic condition data. Driving directions or maneuver instructions are text-based and relatively small in terms of data size, allowing for fairly quick wireless data transmission. On the other hand, the ability to provide graphical, cartographic map display introduces much larger data size overhead. Given the data transfer rates of wireless networks presently and during several years to come, users would experience unacceptably slow performance for map display functionality on remote devices.

The objective of this invention is to introduce a new spatial database system, which reduces the data size, makes it possible to download data in small increments as needed, and which can be used with applications such as navigation systems, for which vector-based functionality is needed.

SUMMARY OF THE INVENTION

The primary object of the invention is to provide a compressed spatial database system, which enables incremental and efficient download of spatial vector data over a network. Another object of the invention is to introduce a location-relevant naming system so that software running on network client devices can efficiently compute data segment file names depending on user interaction with a map or device-supplied location data (e.g. GPS). A third object of the invention is to enable combined online and offline operation capability of a digital map display system. Another object of the invention is to provide server-independent map display capability based on GPS location input. A further object of the invention is to introduce a system allowing updating of dynamic location content without having to retransmit redundant map data. Yet another object of the invention is to enable map centering despite using a segmented data system.

Other objects and advantages of the present invention will become apparent from the following descriptions, taken in connection with the accompanying drawings, wherein, by way of illustration and example, an embodiment of the present invention is disclosed.

In a preferred embodiment of the present invention, a method for organizing and compressing spatial data comprises the steps of parsing a spatial database, separating topographic from attribute information, segmenting the data into rectangles, eliminating subsets of the data points, further reducing the data size by converting the data from a real number format to an integer format, generating location-relevant file names for each of the rectangles and storing the files in permanent storage space. In accordance with a preferred embodiment of the present invention, map display client software computes data file names based on user interactions or device-supplied location information (GPS), fetches the computed file names from a remote server, combines data from several data files to produce an in-memory map image and draws the image on the display screen.

BRIEF DESCRIPTION OF THE DRAWINGS

The drawings constitute a part of this specification and include exemplary embodiments to the invention, which may be embodied in various forms. It is to be understood that in some instances various aspects of the invention may be shown exaggerated or enlarged to facilitate an understanding of the invention wherein.

DETAILED DESCRIPTION OF THE PREFERRED EMBODIMENTS

Detailed descriptions of the preferred embodiment are provided herein. It is to be understood, however, that the present invention may be embodied in vanous forms. Therefore, specific details disclosed herein are not to be interpreted as limiting, but rather as a basis for the claims and as a representative basis for teaching one skilled in the art to employ the present invention in virtually any appropriately detailed system, structure or manner.

Figure 1:
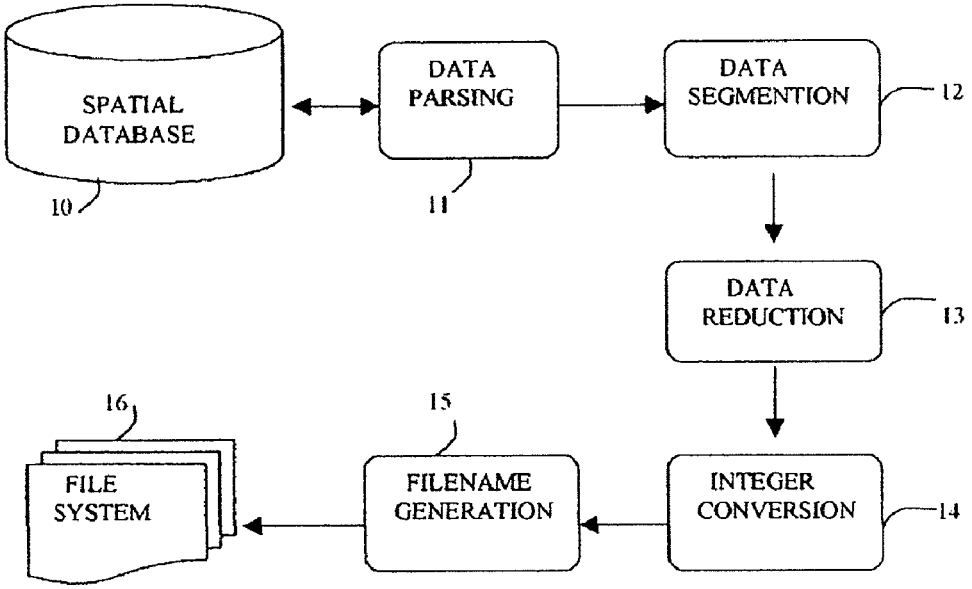
FIG. 1 is a schematic block diagram illustrating the steps to generate a compressed spatial database.

FIG. 1 shows the steps involved in organizing and compressing a spatial database 10. A spatial database comprises topographic information in the form of polygons, lines and points expressed in a geodetic coordinate system (longitude and latitude), and a set of attributes related to the topographic data entities. It is well known in the art that functions using spatial data such as routing or map display only require a subset of the entire data set. For instance, routing does not need to know about lakes and rivers, and map display does not need to know about road turn restrictions and speed limits. It is therefore possible to optimize data sets for use with a particular function. The purpose of this invention is to optimize the data set for map display functionality. The optimization process comprises a number of steps, which are described in more detail below. The initial step 11 consists of parsing the geographic database and extracting all the data for a pre-determined set of features and geographic area. The set of features comprises roads, railways, airports, rivers, lakes, shore lines, parks, points of interest and possibly others, depending how feature-rich the final map display is intended to be. In the preferred embodiment, the pre-determined geographic area is a rectangle of 1° longitude and 0.5° latitude, which will be referred to as a level 2 segment.

The parsed data from step 11 is segmented into topographic components and attribute components in step 12. Attribute information is highly redundant and is therefore an obvious compression target. Attribute information is consolidated using a simple attribute pointer or index mechanism. The topographic and attribute components are then further segmented based on location in two steps. In the preferred embodiment, the first segmentation evenly divides the area into an 8×8 grid. Each topographic data entity along with its attributes of each selected feature is assigned to one of the 64 segments. If the data entity is a polygon or a line and falls into several segments, the data entity is decomposed into two or more pieces using mathematical line and polygon splitting algorithms, and each piece is assigned to the correct segment. The resulting data segments are referred to as level 1 segments and are stored in non-volatile memory. Another segmentation is performed on the parsed data from step 11, this time dividing the area into a 64×64 grid. The resulting 4096 data segments are referred to as level 0 data segments, which are also stored in non-volatile memory.

Figure 2:
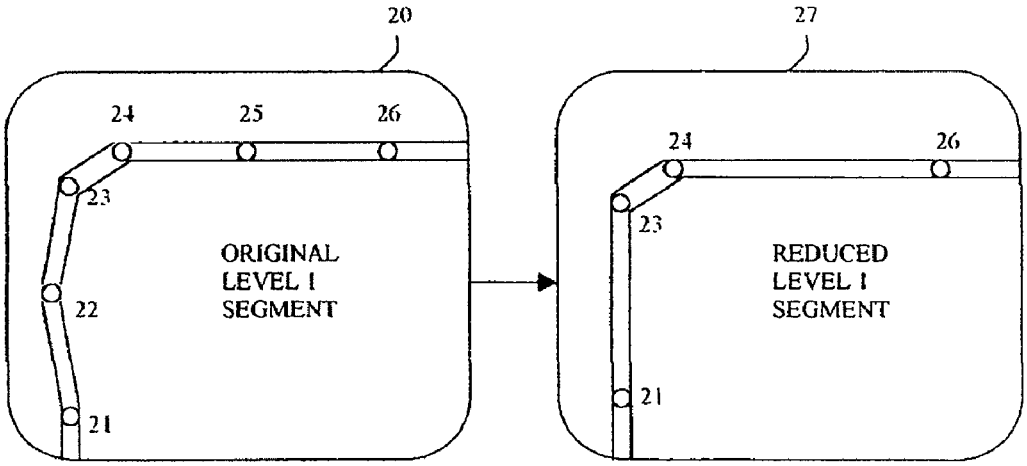
FIG. 2 is a sample view of a road segment before and after applying a data size reduction algorithm.

In step 13, reduction algorithms are performed on level 1 and level 2 data. In the preferred embodiment, level 1 data covers a geographic area of ⅛° longitude by 1/16° latitude. When a map picture is generated for such an area, it is neither desirable nor practical to show all the details, especially when the map picture is shown on a small screen. For instance, it is desirable to show only the main roads, while suppressing the smaller roads. The reduction algorithm used in the preferred embodiments takes these facts into consideration. Two types of data reductions are performed. First, some topographic features such as secondary roads are completely eliminated. Second, the resolution of the remaining topographic features is reduced. Many road data entities contain a number of data points, as shown in FIG. 2, which can be safely eliminated without affecting much the overall geometry of the line or polygon. For instance, the algorithm used in the preferred embodiment eliminates every other data point, provided that the angle between the two lines connecting the point to its adjacent points does not exceed 'n' degrees. Block 20 in FIG. 2 shows a road segment consisting of data points 21 through 26. Block 27 in FIG. 2 shows the same road after two data points, 22 and 25, have been eliminated using the above algorithm. It should be obvious from this example that eliminating these data points did not significantly change the overall shape of the road. Furthermore, it should be noted that the map resolution at this level is fairly low, meaning that data points appearing on a display screen are very close together or even overlapping. Therefore, eliminating data points as described will have no effect on what the viewer sees. After processing all 64 level 1 data files in this way, the level 2 data file is processed in similar fashion. Even more topographic features are completely eliminated. For instance, all roads except for freeways and highways are eliminated, as well as parks, points of interest and possibly other features. Resolution of the remaining topographic features is reduced even further than for level I data, for instance by applying the algorithm several times to the data set.

Integer conversion as referred to in block 15 of FIG. 1 has two advantages. It reduces the data size by at least a factor of two, and it improves processing speed on potentially slow devices. Every geodetic coordinate is broken into two components: an offset and a value. The offset may be an aggregation of multiple offsets, but it always represents the topleft corner of a given rectangle. For any level 2 data segment (Lx-min, Lx-max, Ly-min, Ly-max), where Lx-min stands for minimum longitude, Lx-max for maximum longitude, Ly-min for minimum latitude and Ly-max for maximum latitude, the following formulas are used to compute offsets and values for each data point (x, y), where x is the longitude and y the latitude:

X2-offset=Lx-min

Y2-offset=Ly-max

X2-value=N * (x−x2-offset)

Y2-value=N * (y2-offset−y)

N=upper limit of valid integer values (50000 in the preferred embodiment)

The formulas for computing level 1 offsets and values are:

X1-offset=Abs((x−x2-offset)/((Lx-max−Lx-min)/K))

Y1-offset=Abs((y2-offset-y)/((Ly-max−Ly-min)/K))

X1-value=K*N*(x1−x2-offset−x1-offset)

Y1-value=K*N*(y2-offset−y1-offset−y1)

K=segment divisor (8 in the preferred embodiment for level 1 segments)

The formulas for computing level 0 offsets and values are the same as for level 1, except that K equals 64 in the preferred embodiment.

Figure 3:
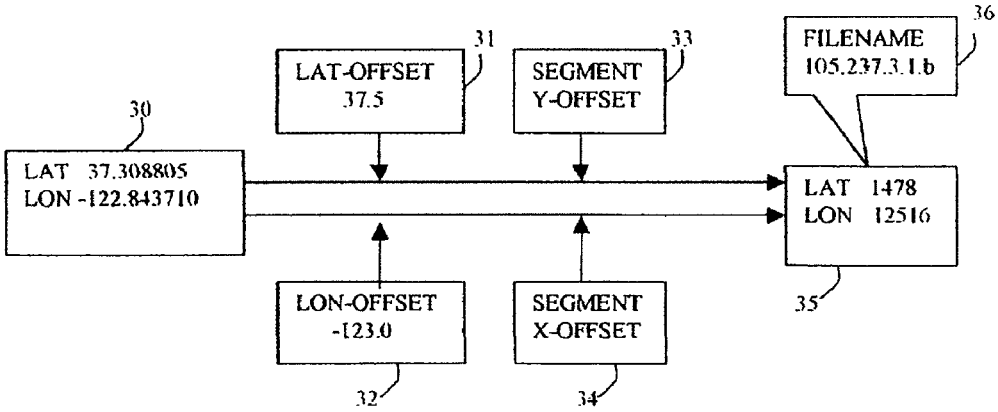
FIG. 3 is a schematic block diagram illustrating the algorithms used for data conversion as well as data segment naming.

The example shown in FIG. 3 applies the above formulas to convert the geodetic coordinates 37.308805 and −122.843710 in block 30 to level 1 integers 1278 and 12516 respectively in block 35.

Level 2 offsets are shown in 31 and 32, while level 1 offsets are shown in 33 and 34. In the preferred embodiment of this invention, the upper limit N is set to 50000, but it could be a different number. The number should not exceed 65536 or 2^16, allowing it to be stored as a 2 byte integer (a short). The number should not be too low, which would result in a loss of spatial accuracy, because several real numbers would map to the same integer. The loss of accuracy is about 1 meter as implemented in the preferred embodiment of this invention.

Once a data segment has been processed and all real numbers converted to integers, a file name is assigned to the data segment as the last step in block 15 of FIG. 1. Since the computed integer values are only distance values from a given base value or offset, they are not reversible to the original real number value without the offset. A simple and efficient way to supply the necessary offset values is to make them part of a file name. As shown in the example of FIG. 3 block 36, a level 1 segment file name is comprised of a total of 4 numbers representing the 4 offsets used to compute integer values for that segment, as well as a letter to indicate the level, the letter 'b' representing level 1. The first number in 36 represents the level 2 latitude offset and the second number in 36 represents the level 2 longitude offset. The third number in 36 represents the level 1 latitude offset, and the fourth number in 36 represents the level 1 longitude offset.

In order to simplify computing requirements, a new geodetic coordinate system is introduced. The North Pole of the earth is at coordinate (0,0) and the South Pole is at (360,360). Unlike in the standard coordinate system, no negative values are used. Every latitude degree in the standard coordinate system corresponds to 2 latitude degrees in the new system. The conversion from the standard to the new coordinate system is accomplished as follows:

New latitude=90−old latitude*2

New longitude=old longitude when range is 0° to 180°

New longitude=180+(180−old longitude) when range is −180° to 0°

In the new coordinate system, moving south and east always results in greater coordinates, while moving west and north always results in smaller coordinates, until the respective end points 0 and 360 are reached. This system significantly reduces the number of exception checking operations required by map display software when compared to the standard coordinate system.

This shows that the file name contains the offset information for the spatial data stored in the file. Thus, map display software can perform a few simple calculations to compute a file name from any geodetic coordinate, which may be supplied by GPS output. It should also be evident that the task of computing file names for data segments adjacent to a given segment is very straightforward using said file-naming system.

Figure 4:
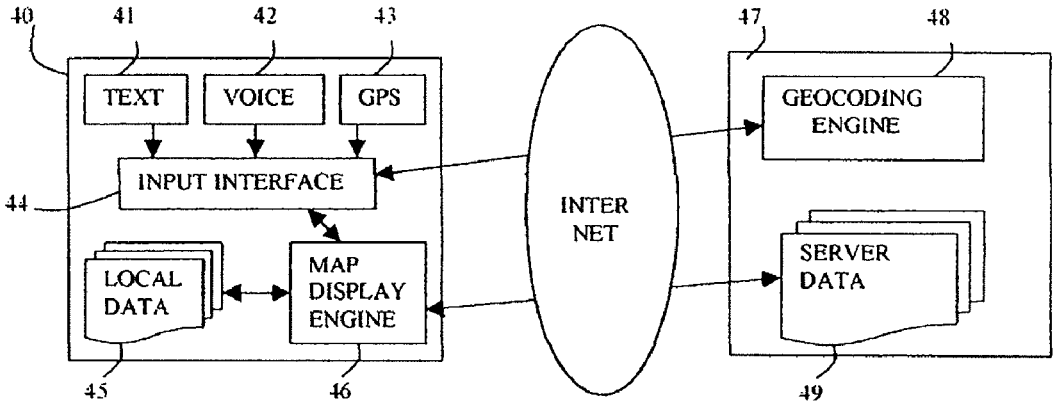
FIG. 4 is a schematic block diagram showing the different components and interactions of a network-based map display system.

The following section describes how a map display program can use said file system and offer desirable functionality such as combined online/offline operation. In a typical embodiment, the map display program is installed on a wireless device such as a smartphone or personal digital assistant. As shown in FIG. 4, a map display system 40 consists of several functional components. The input interface layer 44 handles communication with the user or device. A text-input component lets the user type location information such as an address, a city, a zip code or a start/end point of a trip. The input interface 44 transmits said location information over the network to a geocoding engine 48 residing on a server 47. As is well known in the art, a geocoding engine computes a geodetic coordinate (longitude/latitude) from said information. Once the input interface 44 receives said geodetic coordinate from the geocoding engine 48, it notifies the map display engine 46. Some devices may have voice recognition capabilities. Instead of typing the user speaks said location information. The input interface 44 transmits the information from the voice recognition system 42 to the geocoding engine 48, waits for an answer and forwards it to the map display engine 46. Some devices may have a GPS receiver attached to or incorporated into the device. The input interface 44 processes the GPS output and relays said output to the map display engine 46 without the need to communicate with the geocoding engine 48.

Figure 5:
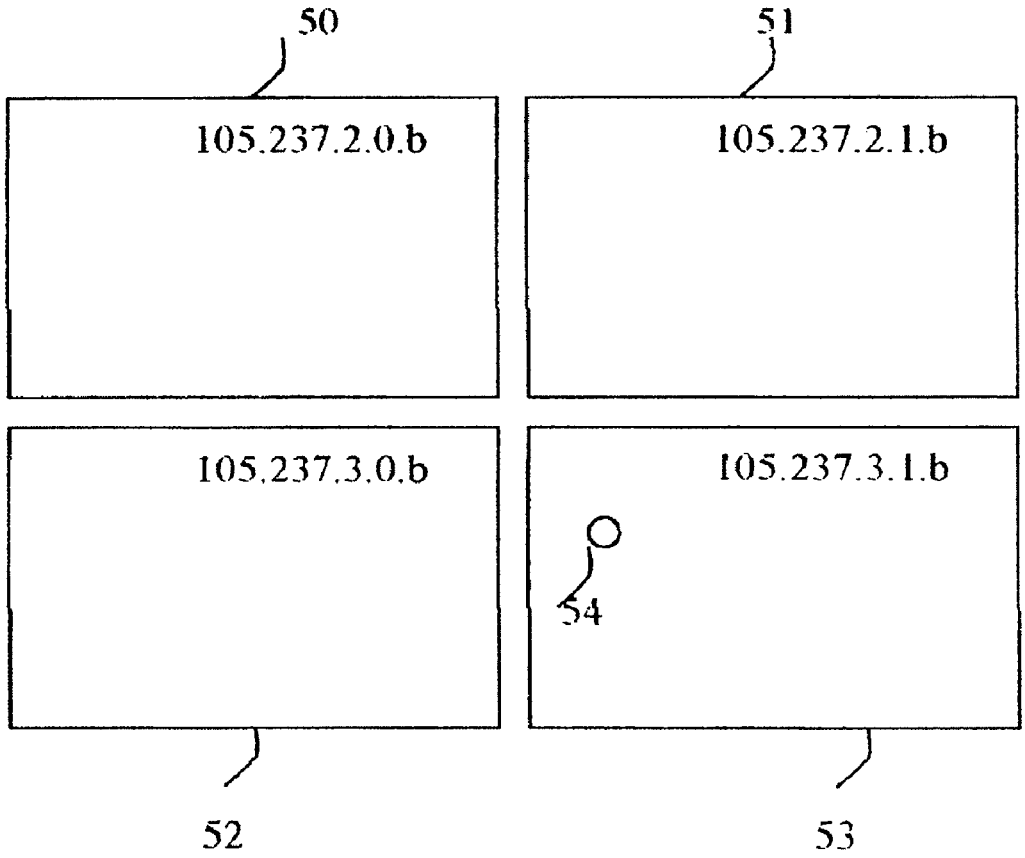
FIG. 5 illustrates which file names are computed by the map display program given a geodetic coordinate.

The map display engine 46 uses said geodetic coordinates received from the input interface 44 to calculate four file names. The input interface 44 also tells the map display engine 46 which data level is needed, e.g. high-resolution level 0 is appropriate when the user specified an address, while level 1 may be more appropriate when the user specified a city or zip code. As has been shown in detail in a previous section, a geodetic coordinate can be decomposed and produce a unique file name. The map display engine 46 could then request said file name from a server 47 on which all files 49 are stored. However, in the preferred embodiment, the map display engine actually computes a total of four file names. If only one file is fetched, the geodetic coordinate of interest to the user could be located somewhere near the edge of said file. It would look awkward to the user and be less informative if the point of interest is not shown at or near the center of the map display screen. The ability to center the map picture has been lost by segmenting the spatial database. The solution employed by the map display engine 46 is to fetch three additional data segment files, which are most adjacent to said geodetic coordinate. The map display engine simply determines into which area, top-left, top-right, bottom-left or bottom-right, said coordinate falls. If a point falls in the top-left quadrant of a file, as does point 54 in FIG. 5, the map display program first finds file 105.237.3.1.b shown in block 53, and then also fetches the file to the top, block 51, to the left, block 52, and to the top-left, block 50. After fetching all 4 files from the server 47, the map display engine combines the data of the 4 files using simple offset calculations before drawing the map picture to the screen. Said geodetic coordinates can now be displayed fairly close (within 25%) of the screen center. An even better center approximation could be achieved by using nine files. Perfect centering can be achieved by not showing a map picture of the entire available data, but instead generate a slightly zoomed-in map picture centered at said coordinate.

One objective of the invention is to provide a flexible mapping system in the sense that the map display system can function online as well as offline. Offline functionality is desirable because it offers the highest speed, since the data is accessed from local storage. The map display engine 46 gives users several options to enable offline capability. Users can select a city or zip code and download all data files for said city or zip code. Furthermore, users can reserve a certain amount of local disk space to be allocated for map data caching. When caching is enabled, the map display engine 46 automatically stores downloaded files on the local disk. As the cache fills up, new data files replace the least frequently accessed data files. A different caching algorithm, for instance based on last accessed time stamps, could be used as well. When the user has selected caching or preloading of data, the map display engine 46 always first scans the local disk space and, if available, loads data files from local space into memory instead of downloading said files from a remote server. Local caching is very useful when users frequently request the same maps. For instance, a user may want to check road traffic conditions on a daily basis. In this case, only updated traffic information such as traffic incident locations or traffic speed maps (a list of measured traffic speeds at different locations) needs to be downloaded. Said updated traffic information can be displayed on a map, which is generated from the map display engine 46 using local map data. Said offline/online capability offers optimal performance for frequently used maps as well as great flexibility regarding local storage capacities of different devices.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the appended claims.

What is claimed is:

[1. A method for organizing spatial data comprising the steps of:

a) parsing the spatial data into a plurality of packets;

b) segmenting the packets;

c) reducing a size of the packets by eliminating at least one data point from at least one display element by applying an angle comparison between an adjacent display element, wherein the at least one data point is eliminated if an angle between the at least one display element and the adjacent display element is about 180°; and d) generating a name for each of the packets.]

[2. The method of claim 1, wherein the spatial data comprises topographic information comprising a plurality of elements containing geodetic coordinates.]

[3. The method of claim 1, wherein the step of parsing the spatial data comprises:

selecting at least one entity within the data, the entity selected from a group consisting of: a road, a railway, an airport, a river, a lake, a shore line, a park, an entity comprising a geometric shape, and an entity comprising a substantially rectangular shape.]

[4. The method of claim 1, wherein the step of parsing the spatial data comprises:

generating a substantially rectangular element comprising about 1° longitude and about ½° latitude.]

[5. The method of claim 1, wherein the step of parsing the spatial data comprises: separating a topographic element from an attribute element;

wherein the topographic element comprises elements expressed using a geodetic coordinate system; and the attribute element is related to the topographic element.]

[6. The method of claim 1, wherein the step of segmenting the packets comprises:

dividing the packets into at least one element, the element selected from a group consisting of: an 8×8 grid, a 64×64 grid, a substantially rectangular grid comprising about 1° longitude and about ½° latitude, and a substantially rectangular grid comprising about ⅛° longitude and about 1/16° latitude.]

[7. The method of claim 1, wherein the step of reducing the size of the segmented packets comprises:

eliminating elements selected from a group consisting of: a polygon, a lake, a geographic area, a topographic element and an attribute element.]

[8. The method of claim 1, wherein the step of reducing the size of the segmented packets comprises:

eliminating a plurality of data points from a topographic element.]

[9. The method of claim 1, wherein the step of reducing the size of the segmented packets comprises:

transforming a geodetic coordinate from a real number to an integer number, wherein the integer number ranges from about 0 to about 65535.]

[10. The method of claim 1, wherein the step of reducing the size of the segmented packets comprises:

eliminating a plurality of data points from at least one topographic element by applying an angle comparison between an adjacent topographic element line, wherein at least one data point is eliminated if an angle between the at least one topographic element and the adjacent topographic element line is about 180°.]

[11. The method of claim 1, wherein the step of generating the name for each of the packets comprises the step of generating a location-relevant naming system.]

[12. The method of claim 1, wherein the step of generating the name for each of the packets comprises the step of generating a location-relevant naming system, wherein the packet name comprises location information representing an offset from an earth origin.]

[13. The method of claim 12, wherein the earth origin is selected from a group consisting of: a North Pole, and a location other than the North Pole.]

[14. The method of claim 1, further including the step of: repeating any one of steps a, b, c and d to process an entire spatial database.]

[15. A method for displaying a map, the method comprising the steps of:

obtaining information relating to a location;

calculating at least one packet name;

determining a data level;

displaying the map; and caching at least one packet until an amount of computer storage space is filled, and determining which packets should be replaced.]

[16. The method of claim 15, wherein the step of calculating the at least one packet name comprises:

computing the at least one data packet name using a geodetic coordinate.]

[17. The method of claim 15, wherein the step of calculating the at least one packet name comprises:

calculating a request location; and using the request location to calculate the at least one packet name.]

[18. The method of claim 15, wherein the step of calculating the at least one packet name comprises:

computing four adjacent data packet names;

fetching the packets from a server; and combining an information contained in the packets to generate a map.]

[19. The method of claim 15, wherein the step of determining the data level comprises:

determining a resolution level selected from a group consisting of: an address, a city, a zip code and a building floor plan.]

[20. The method of claim 15, further including the step of:

caching at least one data packet until an amount of computer storage space is filled, and determining which packets should be replaced.]

[21. The method of claim 15, further including the step of:

checking a local cache before requesting a data packet from a remote device.]

[22. A method for organizing spatial data comprising the steps of:

a) means for parsing the spatial data into a plurality of packets;

b) means for segmenting the packets;

c) means for reducing a size of the packets by eliminating at least one data point from at least one display element by applying an angle comparison between an adjacent display element, wherein the at least one data point is eliminated if an angle between the at least one display element and the adjacent display element is about 180°; and d) means for generating a name for each of the packets.]

*23. A method to reduce data in a digital map, comprising:*

*suppressing selected geographic features; and*

*reducing resolution of remaining geographic features,*

*wherein the reducing comprises eliminating data points, provided that an angle between two lines connecting a data point to its adjacent data points does not exceed a predetermined angle.*

*24. The method of claim 23, wherein the selected geographic features include secondary roads.*

*25. The method of claim 23, wherein the remaining geographic features include primary roads.*

*26. The method of claim 23, wherein the elimination of data points does not significantly change the overall shape of a remaining geographic feature.*

*27. A system for reducing data in a digital map, comprising:*

*means for suppressing selected geographic features; and*

*means for reducing resolution of remaining geographic features, wherein the reducing comprises eliminating data points, provided that an angle between two lines connecting a data point to its adjacent data points does not exceed a predetermined angle.*

*28. The system of claim 27, wherein the selected geographic features include secondary roads.*

*29. The system of claim 27, wherein the remaining geographic features include primary roads.*

*30. The system of claim 27, wherein the elimination of data points does not significantly change the overall shape of a remaining geographic feature.*

*31. A non-transitory computer readable storage medium having stored thereon instructions that when executed by a computer processor perform a method of reducing data in a digital map, the method comprising:*

*suppressing selected geographic features; and*

*reducing resolution of remaining geographic features, wherein the reducing comprises eliminating a data points, provided that an angle between two lines connecting the data point to its adjacent data points does not exceed a predetermined angle.*

*32. The non-transitory computer readable storage medium of claim 31, wherein the selected geographic features include secondary roads.*

*33. The non-transitory computer readable storage medium of claim 31, wherein the remaining geographic features include primary roads.*

*34. The non-transitory computer readable storage medium of claim 31, wherein the elimination of the data points does not significantly change the overall shape of the remaining geographic features.*

*35. The method of claim 23, wherein the predetermined angle is greater than 180 degrees.*

*36. The system of claim 27, wherein the predetermined angle is greater than 180 degrees.*

*37. The non-transitory computer readable storage medium of claim 31, wherein the predetermined angle is greater than 180 degrees.*

*38. A method for reducing data in a digital map, the method comprising:*

*suppressing selected geographic features; and*

*reducing resolution of remaining geographic features by eliminating at least one data point between two adjacent data points only if an angle formed between a first line and a second line does not exceed a predetermined angle, the first line extending through the at least one data point and one adjacent data point of the adjacent data points and the second line extending through the at least one data point and another adjacent data point of the adjacent data points.*

*39. The method of claim 38, wherein the reducing comprises eliminating a plurality of selected data points where, for each of the plurality of selected data points, an angle between a first line extending through the selected data point and a first adjacent data point and a second line extending through the selected data point and a second adjacent data point does not exceed the predetermined angle.*

*40. The method of claim 39, wherein the selected geographic features include secondary roads.*

*41. The method of claim 39, wherein the remaining geographic features include primary roads.*

*42. The method of claim 39, wherein the elimination of the at least one data point does not significantly change the overall shape of the remaining geographic features.*

*43. A system for reducing data in a digital map, the system comprising:*

*means for suppressing selected geographic features; and*

*means for reducing resolution of remaining geographic features by eliminating at least one data point between two adjacent data points only if an angle formed between a first line and a second line does not exceed a predetermined angle, the first line extending through the at least one data point and one of the adjacent data points and the second line extending through the at least one data point and another adjacent data point.*

*44. The system of claim 43, wherein the means for reducing comprises means for eliminating a plurality of selected data points where, for each of the plurality of selected data points, an angle between a first line extending through the selected data point and a first adjacent data point and a second line extending through the selected data point and a second adjacent data point does not exceed the predetermined angle.*

*45. The system of claim 43, wherein the selected geographic features include secondary roads.*

*46. The system of claim 43, wherein the remaining geographic features include primary roads.*

*47. The system of claim 43, wherein the elimination of the at least on data point does not significantly change the overall shape of a remaining geographic feature.*

*48. A non-transitory computer readable storage medium that stores instructions that, when executed by a machine, cause the machine to reduce data in a digital map, the instructions causing the machine to perform steps comprising:*

*suppressing selected geographic features; and*

*reducing resolution of remaining geographic features by eliminating at least one data point between two adjacent data points only if an angle formed between a first line and a second line does not exceed a predetermined angle, the first line extending through the at least one data point and one of the adjacent data points and the second line extending through the at least one data point and another adjacent data point.*

*49. The non-transitory computer readable storage medium of claim 48, wherein the reducing comprises eliminating a plurality of selected data points where, for each of the plurality of selected data points, an angle between a first line extending through the selected data point and a first adjacent data point and a second line extending through the selected data point and a second adjacent data point does not exceed the predetermined angle.*

*50. The non-transitory computer readable storage medium of claim 48, wherein the selected geographic features include secondary roads.*

*51. The non-transitory computer readable storage medium of claim 48, wherein the remaining geographic features include primary roads.*

*52. The non-transitory computer readable storage medium of claim 48, wherein the elimination of the at least one data point does not significantly change the overall shape of the remaining geographic features.*

* * * * *